United States Patent
Smith et al.

(10) Patent No.: US 8,525,419 B2
(45) Date of Patent: Sep. 3, 2013

(54) HIGH VOLTAGE ISOLATION AND COOLING FOR AN INDUCTIVELY COUPLED PLASMA ION SOURCE

(75) Inventors: Noel S. Smith, Lake Oswego, OR (US); Noel P. Martin, Hillsboro, OR (US); Paul P. Tesch, Portland, OR (US)

(73) Assignee: Oregon Physics, LLC, Hillsboro, OR (US)

( * ) Notice: Subject to any disclaimer, the term of this patent is extended or adjusted under 35 U.S.C. 154(b) by 791 days.

(21) Appl. No.: 12/623,196

(22) Filed: Nov. 20, 2009

(65) Prior Publication Data

US 2010/0126964 A1 May 27, 2010

Related U.S. Application Data

(60) Provisional application No. 61/117,907, filed on Nov. 25, 2008.

(51) Int. Cl.
*H01J 7/24* (2006.01)

(52) U.S. Cl.
USPC ............................. 315/111.81; 315/111.21

(58) Field of Classification Search
USPC ............ 315/111.21, 111.31, 111.51, 11.81, 315/111.91; 216/68; 156/345.35–345.47
See application file for complete search history.

(56) References Cited

U.S. PATENT DOCUMENTS

| 5,468,955 | A * | 11/1995 | Chen et al. ................... 250/251 |
| 5,681,418 | A | 10/1997 | Ishimaru |
| 6,545,420 | B1 * | 4/2003 | Collins et al. ............ 315/111.51 |
| 6,768,120 | B2 * | 7/2004 | Leung et al. ................ 250/423 R |
| 7,241,361 | B2 | 7/2007 | Keller et al. |
| 7,298,091 | B2 | 11/2007 | Pickard et al. |
| 7,629,590 | B2 * | 12/2009 | Horsky et al. ............. 250/423 R |
| 2004/0262237 | A1 * | 12/2004 | Kornbrekke et al. ........ 210/748 |
| 2007/0034154 | A1 | 2/2007 | Fink |
| 2007/0278417 | A1 * | 12/2007 | Horsky et al. ................. 250/427 |
| 2008/0080659 | A1 * | 4/2008 | Leung et al. .................. 376/114 |

OTHER PUBLICATIONS

"CeramTec High Voltage Isolator Catalog," CeramTec North America Corporation, pp. 163 and 165, accessed Feb. 29, 2008.
Brown, Ian G., Radio-Frequency Driven Ion Sources, The Physics and Technology of Ion Sources, 2nd Edition, Nov. 2004, pp. 163-175, Wiley-VCH, Weinheim, Germany.
"RFVII Brochure," RFVII Incorporated, 10 pages, accessed Feb. 29, 2008.

(Continued)

*Primary Examiner* — Douglas W Owens
*Assistant Examiner* — Amy Yang
(74) *Attorney, Agent, or Firm* — Marger, Johnson & McCollom, P.C.

(57) ABSTRACT

A plasma source for processing or imaging a substrate, for ion source for proton therapy, for ion thrusters, or for high energy particle accelerators includes a coolant circuit passing adjacent to a plasma ion reactor chamber and RF antenna coils. In a method for operating the plasma ion source having an induction coil adjacent to a reaction chamber for inductively coupling power into the plasma from a radio frequency power source, the method comprises pumping a dielectric fluid into contact with induction coils of the plasma ion source along the coolant circuit. Use of the dielectric fluid both electrically insulates the plasma chamber, so that it can be biased to 30 kV and up, and efficiently transfers heat away from the plasma chamber.

19 Claims, 3 Drawing Sheets

(56) References Cited

OTHER PUBLICATIONS

Wang, Yicheng and Olthoff, J. K., Ion energy distributions in inductively coupled radio-frequency discharges in argon, nitrogen, oxygen, chlorine, and their mixtures, Journal of Applied Physics, May 1, 1999, 8 pages, vol. 85, No. 9.

"IMG-31 / IGPS-31 Microwave Ion Source / Power Supply," Kimball Physics Inc., 2 pages, accessed Apr. 4, 2011.

Iwai, H., Morohashi, T., Negri, R. E., Ogata, A., Hoshi, T. and Oiwa, R., A Study of Charge Compensation for Insulator Sampled in AES by Low Energy Ion Beam Irradiation, Journal of Surface Analysis, 1999, 4 pages, vol. 5, No. 1.

Okada, K., Komatsu, S. and Matsumoto, S., Diagnostics of Low Pressure Inductively Coupled VHF Plasma Used for Nanostructured Carbon Deposition, 28th International Conference of Phenomena in Ionized Gases, Jul. 15-20, 2007, 2 pages, Prague, Czech Republic.

"Plasma Controller, Oxford Scientific "OSPrey RF"," Oxford Scientific, 1 page, accessed Apr. 4, 2011.

Wagenaars, Erik, Plasma Breakdown of Low-Pressure Gas Discharges, Nov. 30, 2006, pp. 6-7, Eindhoven University of Technology, Eindhoven, Netherlands.

Sobolewski, M. A., Olthoff, J. K. and Wang, Y., Ion energy distributions and sheath voltages in a radio-frequency-biased, inductively coupled, high-density plasma reactor, Journal of Applied Physics, Apr. 15, 1999, 10 pages, vol. 85, No. 8.

"Xe Sputter Yields," National Physical Laboratory, May 12, 2005, 6 pages.

Ji, Q., Leung, K., King, T., Jiang, X. and Appleton, B., Development of focused ion beam systems with various ion species, Nuclear Instruments and Methods in Physics Research B: Beam Interactions with Materials and Atoms, Dec. 2005, pp. 335-340, vol. 241, Issues 1-4.

Jiang, X., Ji, Q., Chang, A. and Leung, K. N., Mini rf-driven ion sources for focused ion beam systems, Review of Scientific Instruments, Apr. 2003, pp. 2288-2292, vol. 74, No. 4.

Nabhiraj, P.Y., Menon, R., Mallik, C. and Bhandari, R.K., Design of High Current RF Ion Source for Micromachining Applications, Asian Particle Accelerator Conference 2007, pp. 262-264, Indore, India.

Smith, N. S., Skoczylas, W. P., Kellogg, S. M., Kinion, D. E. and Tesch, P. P., High brightness inductively coupled plasma source for high current focused ion beam applications, Journal of Vacuum Science and Technology B—Microelectronics and Nanometer Structures, Nov./Dec. 2006, pp. 2902-2906, vol. 24, No. 6.

Panagopoulos, T. and Economou, D. J., Plasma sheath model and ion energy distribution for all radio frequencies, Journal of Applied Physics, Apr. 1, 1999, pp. 3435-3443, vol. 85, No. 7.

Hayes, A. V., Kanarov, V., Yevtukhov, R., Williams, K., Hines, D., Druz, B. and Hegde, H., Recent advances in Veeco's radio frequency ion sources for ion beam materials processing applications—Abstract, Review of Scientific Instruments, Feb. 2002, 1 page, vol. 73, No. 2.

Speth E. and NBI-Group, Overview of RF Source Development at IPP, CCNB-Meeting at Padua, Jun. 5-6, 2003, 29 pages.

Welton, R., Ion Source R&D at the SNS, Accelerator Physics and Technology Seminar, Fermilab, Jan. 19, 2006, 32 pages.

Mordyk, S., Miroshnichenko, V., Nagornyy, A., Nagornyy, D., Shulha, D., Storizhko, V. and Voznyy, V., High-plasma-density helicon source for ion beam application, 13th International Congress on Plasma Physics, May 22-26, 2006, 4 pages, Kiev, Ukraine.

Sobolewski, M. A., Wang, Y. and Goyette, A., Measurements and modeling of ion energy distributions in high-density radio-frequency biased CF4 discharges, Journal of Applied Physics, May 15, 2002, pp. 6303-6314, vol. 91, No. 10.

Welton, R. F., Stockli, M. P. and Murray, S. N., Development and Status of the SNS Ion Source, Proceedings of the 2003 Particle Accelerator Conference, pp. 3306-3308, IEEE.

* cited by examiner

US 8,525,419 B2

HIGH VOLTAGE ISOLATION AND COOLING FOR AN INDUCTIVELY COUPLED PLASMA ION SOURCE

CROSS-REFERENCES TO RELATED APPLICATIONS

This application claims the benefit from U.S. Provisional Patent Application No. 61/117,907 filed Nov. 25, 2008 whose contents are incorporated herein for all purposes.

BACKGROUND OF THE INVENTION

1. Field of the Invention

This invention relates generally to plasma ion sources and more particularly to methods for shielding and cooling such plasma sources.

3. Description of the Prior Art

Focused ion beam (FIB) tools are used for nanometer scale precision material removal. The benefits of FIB tools include nano-scale beam placement accuracy, a combined imaging and patterning system for accurate part registration and pattern placement, and low structural damage of the area surrounding the removed volume. However, conventional FIB systems typically have a maximum removal rate of $\sim 5\ \mu m^3/s$ that limits their usefulness for removing volumes with dimensions exceeding 10 μm. Conventional FIB systems are further limited by the low angular intensity of the ion source, so at large beam currents the beam size dramatically increases from spherical aberration. For high beam currents and hence high removal rates of material, a high angular intensity is required, along with high brightness and low energy spread.

One solution is to use plasma ion sources. Inductively coupled plasma ion sources typically wrap an RF antenna about a plasma chamber. Energy is transferred by inductively coupling power from the antenna into the plasma.

Other applications for this type of plasma source include its use as the primary ion source for Secondary Ion Mass Spectrometry (SIMS), Ion Scattering Spectroscopy (ISS), focused and projection ion beam lithography, proton therapy, and high energy particle accelerators.

In all cases, a high power density is deposited into the plasma from the antenna in order to create a high density plasma, and the plasma is biased to a potential of several thousand volts with respect to ground.

Due to the high power density and high voltage bias applied to the plasma, two issues arise with devices using inductively coupled plasma ion sources: (a) how to keep the device cool, and (b) how to electrically insulate the plasma chamber. The heat issue arises because of the RF energy applied to the antenna and inductively coupled to the plasma chamber. The isolation issue arises because the plasma chamber is biased to a high voltage whereas the surrounding RF antenna and the electrostatic Faraday shield used to terminate the time-varying electric field and screen it from the plasma are typically biased to ground.

Accordingly, the need arises for new designs and methods that allow effective operation of plasma ion sources without overheating and with adequate insulation between elements biased to different voltages.

SUMMARY OF THE INVENTION

The present invention provides a solution for the heat and insulation issues simultaneously.

In a plasma source having an induction coil adjacent to a reactor chamber for inductively coupling power into the plasma from a radio frequency power source, a method for operating the source according to the invention comprises actively biasing the reactor chamber to a high voltage; and pumping a dielectric fluid into contact with the induction coils and reactor chamber outer walls of the plasma ion source. Use of the dielectric fluid both electrically insulates the plasma chamber, so that it can be biased to 30 kV and up, and efficiently transfers heat away from the plasma chamber.

A plasma ion source is disclosed, where the plasma ion source may be used for processing or imaging a substrate, as an ion source for proton therapy, as ion thrusters, and in high energy particle accelerators. The source comprises a reactor chamber within which a plasma is generated to produce at least one plasma product for processing or imaging the substrate. The reactor chamber includes outer walls that are actively biased to a high voltage. A gas source is coupled to the reactor chamber to provide gas into the reaction chamber. An exit aperture exists to allow extraction of gas in the form of ions from the reactor chamber. A first source of radio frequency power is provided and a plurality of induction coils adjacent to the reactor chamber is coupled to the first source. The induction coils are configured to inductively couple power into the plasma from the first source of radio frequency power. A coolant fluid circuit is defined within the plasma source in contact with the induction coils and reactor chamber and a source of dielectric fluid in fluid communication with the coolant circuit. Coolant circulated through the fluid circuit carries heat away from adjacent elements of the plasma ion source. And because of the coolant's dielectric nature, proper electrical isolation is maintained between the plasma chamber (maintained at high voltage) and the Faraday shield, antenna, and other structures in the source maintained at ground potential.

The foregoing and other objects, features and advantages of the invention will become more readily apparent from the following detailed description of a preferred embodiment of the invention that proceeds with reference to the accompanying drawings.

DETAILED DESCRIPTION OF THE INVENTION

Figure 1:
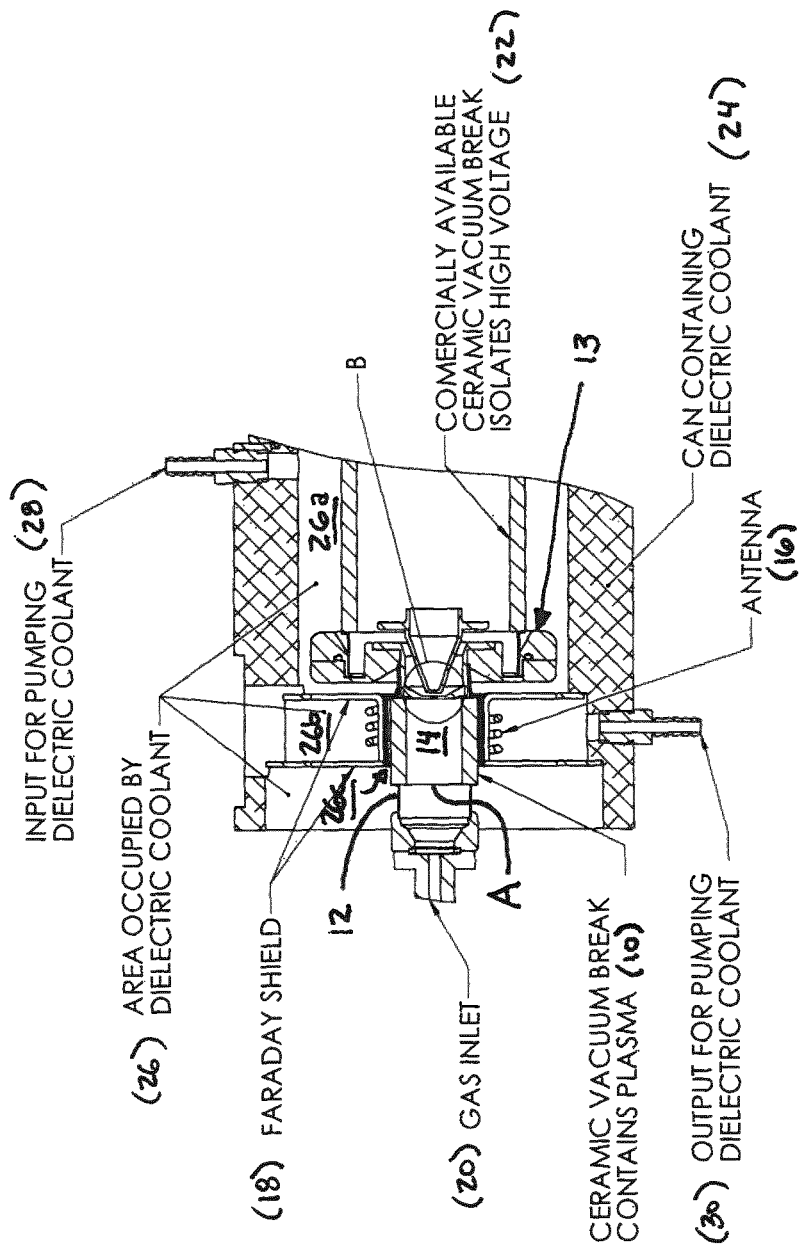
FIG. 1 is a side elevation view showing a focused ion beam (FIB) device in section incorporating a plasma ion source implemented according to teachings of the present invention.

The inductively coupled plasma source includes a ceramic tube 10, enclosing the plasma chamber 14, welded between a first upstream metal flange 12 and a second downsteam vacuum flange 13. Windings of an RF antenna 16 are wrapped around, but electrically isolated (e.g. slightly spaced) from, the cylindrical outer walls of ceramic tube 10. As will be further appreciated through the description below, RF antenna 16 is further electrically isolated from the cylindrical outer walls of the ceramic tube 10 by filling of the space between them with a dielectric fluid. A split Faraday shield 18 surrounds the cylindrical outer walls of ceramic tube 10 and is interposed between the RF antenna 16 and the ceramic tube 10. Shield 18 includes a plurality of slits through the wall of the shield 18 facing the ceramic tube 10, with a space between the shield 18 and tube 10 being filled with the dielectric fluid.

A gas inlet 20 communicates with an upstream opening A in the plasma chamber 14 to supply material that is later formed into a plasma. Plasma chamber 14 is referenced to high voltage while the surrounding RF shielding—e.g. implemented as Faraday shield 16—and RF antenna making plural windings about the ceramic tube 10, are referenced to ground.

A source electrode of the plasma chamber has an exit aperture B, opposite the side adjacent the gas inlet 20, and is in further communication with an extraction electrode and focusing optics located downstream (not shown). Ions extracted from the plasma are then focused into a beam and directed downstream within a ceramic vacuum break 22. All elements are retained within a can 24 that surrounds the whole assembly and is held at ground potential. Assembly in this way forms spaces 26 between the can and the outer surface of the plasma chamber and ceramic vacuum break (space 26a), between the antenna and the Faraday shield (space 26b), and particularly between the ceramic plasma tube 10 and the Faraday shield 18 (space 26c). All spaces are in fluid communication with one another, and form a fluid circuit, so that a fluid introduced through inlet 28 can be pumped through all spaces and exit outlet 30.

Operation of the RF plasma source results in significant power being deposited into the plasma and the antenna, which would create thermal issues and failure within the device if efficient heat dissipation were not implemented. Air cooling may be used, but such is typically inefficient within a small space such as that defined by the plasma ion source. Water cooling is also a possibility for cooling, but it has poor dielectric properties and its reactivity with other materials can create problems. Furthermore, maintaining different parts of the assembly at different voltages also creates operational issues absent adequate insulation between the parts.

The invention uses a dielectric fluid as a coolant. The dielectric fluid has been found to exhibit efficient coolant properties when used in the environment of the plasma ion source. Furthermore, a dielectric fluid provides high voltage isolation between the plasma chamber (at high voltage) and the other parts at ground potential. The dielectric fluid also can provide high voltage isolation between the antenna and the Faraday shield. A cooling circuit is created within the device so that the dielectric fluid circulates between the plasma chamber 14 and the can 24 throughout the device, and preferably through spaces 26a, 26b, and 26c. Use of the dielectric coolant around the inductively coupled plasma ion source has been found to keep the plasma chamber and antenna operating at a stable temperature (near room temperature) and reduces the gaps required for high voltage stability. More specifically, use of the dielectric fluid both electrically insulates the plasma chamber, so that it can be biased to 30 kV and up, and efficiently transfers heat away from the plasma chamber. The advantages of this approach are:

1. The entire outer surface of the plasma chamber and antenna can have their thermal energy efficiently transferred away from the ion source.
2. The split Faraday shield can be held at ground potential while maintaining a minimal gap between the shield and the plasma chamber. Consequently, the antenna can be in close proximity to the plasma chamber so that power coupling is more efficient.
3. The antenna, and the matchbox and RF amplifier used to drive the antenna, are ground referenced (i.e. are not biased at the same potential as the plasma).
4. The dielectric fluid is chemically inert and has a very low power dissipation factor (loss tangent) at RF frequencies. This is unlike water that is susceptible to large variations in its loss tangent depending on its purity.

In a preferred embodiment, the dielectric coolant is a fluorinated fluid, and the pumping flow is between a heat exchanger (or chiller) and the plasma source. The coolant preferably has a low relative permittivity (dielectric constant), in the range of between 1 and 3, and a high dielectric strength (e.g. greater than 10 kV/nun). The preferable flow rate through the cooling circuit is between about 0.5 and 1.5 gallons per minute, with a most preferred rate of approximately 1 gallon/minute.

Figure 2:
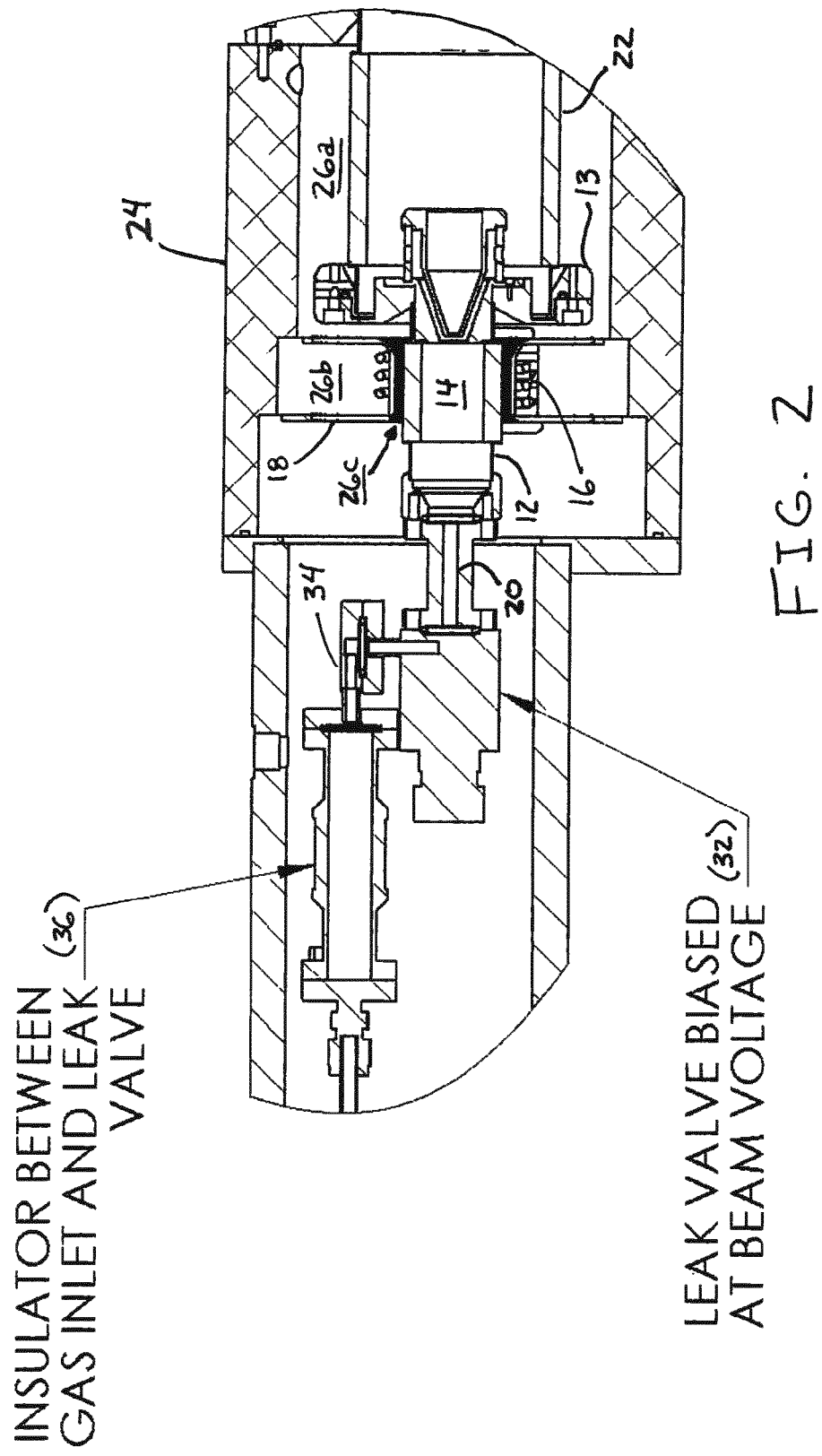
FIG. 2 is a side elevation view showing a larger view of the focused ion beam (FIG) device in section including a further upstream section of the gas supply apparatus.

FIG. 2 is a side elevation view in section of a plasma ion source constructed according to a preferred embodiment of the invention. Like elements from FIG. 1 are labeled but not discussed further here. Moving upstream from gas inlet 20, a leak valve 32 supplies a low pressure (e.g. approximately 10-100 mTorr) gas into the plasma chamber 10, which in turn receives gas through flange 34 from insulator 36. As will be appreciated from a description of FIG. 3, high voltage applied to downstream flange 13 contributes to the igniting of plasma within ceramic chamber 14. This conducts potential upstream along the plasma so that ceramic chamber 14, kovar flange 12, inlet 20, leak valve 32 and flange 34 are electrically coupled together at the same (high voltage) potential. The leak valve 32 cuts the pressure of gas in the line from about 5-10 psi to an amount supplied to the gas inlet 20 and thence to the plasma chamber 10 of about 10-100 mTorr.

In order to prevent a high voltage from being maintained at the gas source, an insulator 36 is interposed between the gas source (not shown) and the downstream plasma source. Insulator includes a centrally located ceramic tube brazed on both sides by a kovar structure. Because the gas pressure within the insulator is between about 5-10 psi, this is too high to ignite a plasma at the particular high voltage used, and thus no plasma exists to transfer the potential across the ceramic tube of the insulator. Accordingly, everything to the left of insulator 36 in FIG. 2 is maintained at ground while that to the right is kept at the high voltage applied.

In one aspect of the invention, the plasma tube 10 is electrically isolated from ground by a combination of mechanical insulating support structures and the dielectric fluid. The insulating support structures are configured to position the plasma tube 10 within the assembly so that it does not touch can 24, shield 18, RF antenna 16 or other elements held at a different potential. Examples of such insulated support structures includes ceramic vacuum break 22 and insulator 36 (FIG. 2). An external high voltage (up to about 100 kV), and preferably about 30 kV, is applied to the plasma tube and the current design uses the dielectric fluid to isolate the plasma tube at applied voltage from the Faraday shield 18, antenna 16, and other structures in the source at ground potential. Alternately, low voltages in the range of about 50V to 5000V could be used for low voltage applications. This design is unique in that both the plasma tube and the antenna are electrically isolated and cooled by the dielectric fluid.

Another aspect of the design is that the plasma tube is substantially or completely immersed into the dielectric fluid so that the fluid can effectively transfer heat away from the plasma tube. In wafer processing configurations, the whole plasma chamber may not be immersed in fluid but typically an antenna is immersed in fluid and a dielectric window near the antenna is partially immersed in fluid. However, most of the chamber containing the plasma is not immersed in fluid.

In the present design, ions are removed from the plasma and then the ions interact with a substrate outside of the plasma. The external voltage is applied to control how energetic the ions are when they interact with the substrate. The ions are typically focused and deflected after they have been extracted from the plasma. The present design includes a means for extracting the ions and accelerating the ions to the applied voltage.

Figure 3:
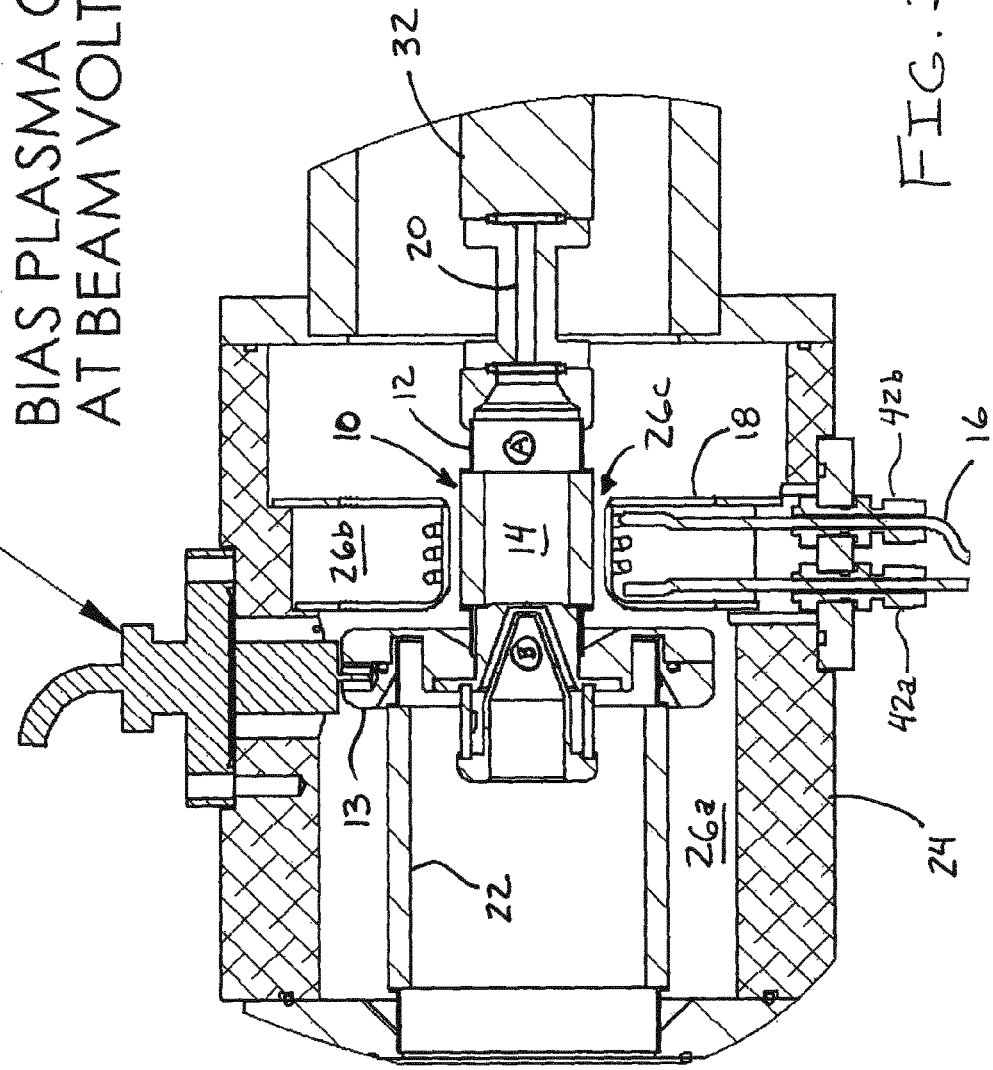
FIG. 3 is a side elevation view in section showing a high voltage input into the plasma ion source of the present invention.

FIG. 3 illustrates the device in section side elevation with the high voltage connector 40 shown. Like elements from previous figures are similarly labeled but not further described. The high voltage connector 40 passes through a penetration in can 24 and couples with the downstream vacuum flange 13. This flange is in metal contact with plasma chamber 10 so that when the plasma ions are ignited, the potential is carried across the chamber to the upstream flange 12, gas inlet 20, and leak valve 32. FIG. 3 also better illustrates the gap 26c between the Faraday shield 18 inside wall and the outside wall of the plasma chamber 10.

As shown in FIG. 3, RF antenna 16 passes through electrically isolated penetrations within can 24 and thence form windings around the circumference of the cylindrical outer wall of plasma chamber 10. These penetrations are made fluid tight by incorporating plugs 42a, 42b between the antenna 16 and penetration walls. By being fluid tight, the dielectric fluid may be circulated within space 26b without inadvertently escaping the can 24.

Also described is a method for operating a plasma ion source having induction coils adjacent to outer walls of a reactor chamber for inductively coupling power into the plasma from a radio frequency power source. The method comprises actively biasing the reactor chamber to a high voltage and pumping a dielectric fluid into contact with the induction coils and a substantial portion of the outer walls of the reactor chamber wherein both the reactor chamber and induction coils are electrically isolated and cooled by the dielectric fluid. The step of actively biasing the reactor chamber to a high voltage preferably includes biasing the reactor chamber to a voltage above about 30 kV.

The dielectric fluid can be pumped in a circuit through a plurality of spaces in fluid communication with one another. The plurality of spaces include a space adjacent the induction coils, a space adjacent outer walls of the reactor chamber, and a space adjacent a vacuum break downstream of the reaction chamber. The method further preferably includes enclosing the induction coils with a split Faraday shield and enclosing the Faraday shield, reaction chamber, and vacuum break in a can to retain the dielectric fluid. The Faraday shield is preferably maintained at a ground potential. The circuit through which dielectric fluid is pumped includes a space between the can and the vacuum break and the can and plasma chamber.

The method can further include maintaining different elements of the plasma ion source at different voltages and providing a high voltage isolation between the antenna and Faraday shield. Furthermore, the step of pumping the dielectric fluid includes pumping the fluid through a circuit into and out of the plasma ion source at a rate of between about 0.5 and 1.5 gallons per minute and more preferably approximately 1 gallon/minute.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A plasma source comprising:
    a reactor chamber within which a plasma is generated to produce at least one plasma product for processing or imaging the substrate, as an ion source for proton therapy, as ion thrusters, or in high energy particle accelerators, the reactor chamber including outer walls that are all actively biased to a high voltage;
    a gas source coupled to the reactor chamber to provide gas into the reaction chamber;
    an exit aperture coupled to the reactor chamber to allow extraction of ions from the reactor chamber;
    a first source of radio frequency power;
    a plurality of induction coils adjacent to the reactor chamber and coupled to said first source of radio frequency power to inductively couple power into the plasma from said first source of radio frequency power;
    a coolant fluid circuit defined within the plasma source in contact with the induction coils and reactor chamber; and
    a source of dielectric fluid in fluid communication with the coolant circuit wherein both the reactor chamber and induction coils are electrically isolated from each other and from ground and cooled by the dielectric fluid.

2. The plasma source of claim 1, further including a split Faraday shield interposed between the induction coils and reactor chamber, said shield being configured to capacitively shield the reactor chamber.

3. The plasma source of claim 2, wherein the split Faraday shield surrounds and is spaced from outer walls of the reaction chamber, the induction coils received within walls of the Faraday shield.

4. The plasma source of claim 1, further including a can enclosing the reaction chamber, the Faraday shield, and the induction coils, wherein the coolant fluid circuit includes a space between the can and an outer surface of the reactor chamber, a space between the Faraday shield and the reactor chamber, and a space adjacent the induction coils.

5. The plasma source of claim 1, wherein the coolant fluid is a dielectric coolant having a dielectric constant of between about 1 and 3 and a high dielectric strength of above 10 kV/mm.

6. The plasma source of claim 5, wherein the dielectric coolant is a fluorinated fluid.

7. The plasma source of claim 1, further including insulating support structures configured to electrically isolate the reactor chamber from ground.

8. The plasma source of claim 1, wherein a substantial portion of the reaction chamber is immersed into the dielectric fluid.

9. The plasma source of claim 1, further including means for extracting ions from the reactor chamber and accelerating the ions to an applied voltage.

10. A method for operating a plasma ion source having induction coils adjacent to outer walls of a reactor chamber, the method comprising:
    actively biasing the reactor chamber including all outer walls to a high voltage;
    electrically isolating the reactor chamber and induction coils from each other and from ground;
    providing gas into the reaction chamber;
    allowing extraction of ions from the reactor chamber;
    inductively coupling power into the plasma from a radio frequency power source; and
    pumping a dielectric fluid into contact with the induction coils and a substantial portion of the outer walls of the reactor chamber wherein both the reactor chamber and induction coils are electrically isolated and cooled by the dielectric fluid.

11. The method of claim 10, further including the step of pumping the dielectric fluid in a circuit through a plurality of spaces in fluid communication with one another, the plurality of spaces including a space adjacent the induction coils, a space adjacent outer walls of the reactor chamber, and a space adjacent a vacuum break downstream of the reaction chamber.

12. The method of claim 11, wherein the plasma ion source includes a Faraday shield enclosing the induction coils and a can enclosing the Faraday shield, reaction chamber, and vacuum break, the circuit through which dielectric fluid is pumped including a space between the can and the vacuum break and the can and plasma chamber.

13. The method of claim 11, wherein the plasma ion source includes a split Faraday shield, the method including maintaining the split Faraday shield at a ground potential.

14. The method of claim 10, further including the steps of:
   maintaining different elements of the plasma ion source at different voltages; and
   providing a high voltage isolation between the antenna and Faraday shield.

15. The method of claim 10, wherein the step of actively biasing the reactor chamber to a high voltage includes biasing the reactor chamber to a voltage above about 30 kV.

16. The method of claim 10, wherein the step of pumping the dielectric fluid includes pumping the fluid through a circuit into and out of the plasma ion source at a rate of between about 0.5 and 1.5 gallons per minute.

17. The method of claim 16, wherein the rate is approximately 1 gallon/minute.

18. The method of claim 10, wherein the dielectric coolant has a dielectric constant of between about 1 and 3 and a high dielectric strength of above 10 kV/mm.

19. The method of claim 18, wherein the dielectric coolant is a fluorinated fluid.

* * * * *